United States Patent
Zhou et al.

(10) Patent No.: US 6,686,227 B2
(45) Date of Patent: Feb. 3, 2004

(54) METHOD AND SYSTEM FOR EXPOSED DIE MOLDING FOR INTEGRATED CIRCUIT PACKAGING

(75) Inventors: Tiao Zhou, Irving, TX (US); Michael J. Hundt, Double Oak, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/062,218

(22) Filed: Feb. 1, 2002

(65) Prior Publication Data

US 2003/0148556 A1 Aug. 7, 2003

(51) Int. Cl.[7] .................. H01L 21/44; H01L 21/48; H01L 21/50
(52) U.S. Cl. ............ 438/127; 438/51; 438/106; 438/117
(58) Field of Search ................ 425/542, 558; 438/51, 55, 64, 65, 106–109, 112, 117–119, 121, 124–127

(56) References Cited

U.S. PATENT DOCUMENTS 5,049,526 A * 9/1991 McShane et al. ............ 29/827
5,656,549 A * 8/1997 Woosley et al. ............ 438/118

* cited by examiner

*Primary Examiner*—Evan Pert
*Assistant Examiner*—Asok Kumar Sarkar
(74) *Attorney, Agent, or Firm*—Lisa K. Jorgenson; William A. Munck

(57) ABSTRACT

A method for exposed die molding for integrated circuit packaging is provided that includes providing a mold comprising an upper mold with a flexible material, a lower mold, and a floating plunger. A substrate of an integrated circuit structure is clamped between the upper mold and the lower mold. An integrated circuit die of the integrated circuit structure is clamped between the floating plunger and the upper mold through the flexible material.

20 Claims, 3 Drawing Sheets

METHOD AND SYSTEM FOR EXPOSED DIE MOLDING FOR INTEGRATED CIRCUIT PACKAGING

TECHNICAL FIELD OF THE INVENTION

The present invention is directed in general to integrated circuits and, more specifically, to a method and system for exposed die molding for integrated circuit packaging.

BACKGROUND OF THE INVENTION

A conventional plastic integrated circuit package generally comprises a lead frame or substrate, an integrated circuit die made of silicon, and a protective layer to protect the die and the electrical connections between the die and the substrate.

The protective layer is generally formed in the integrated circuit package through the use of a mold. The integrated circuit is placed between an upper mold and a lower mold while the material of the protective layer is injected around the integrated circuit, after which the material is allowed to harden. Recent improvements in this process have included the use of a flexible material between the upper mold and the integrated circuit in order to prevent damage to the integrated circuit from the hard surface of the upper mold.

The integrated circuit is typically applied to the substrate with an adhesive layer. Based on possible characteristics of the adhesive layer, the molding process has to accommodate a specified variation associated with the integrated circuit package. These characteristics generally include bondline thickness and tilt.

Bondline thickness is the average thickness of the adhesive layer in an integrated circuit. The molding process has to accommodate the variation in bondline thickness, or the bondline thickness consistency, for all the integrated circuits in a set of integrated circuits being processed. Thus, for example, if the minimum average thickness of the adhesive layer is 20 microns and the maximum average thickness of the adhesive layer is 50 microns, the bondline thickness consistency is 30 microns. In this situation, the molding process has to accommodate 30 microns for bondline thickness.

Tilt is the difference between the minimum and maximum thickness of an adhesive layer in an integrated circuit. The molding process has to accommodate the tilt variation for all the integrated circuits in a set of integrated circuits being processed. Thus, for example, if the minimum tilt of the adhesive layer is 0 microns and the maximum tilt of the adhesive layer is 30 microns, the tilt variation is 30 microns. In this situation, the molding process has to accommodate 30 microns for tilt variation.

Thus, using the above examples, the molding process has to accommodate an overall variation of 60 microns while processing a particular set of integrated circuits. This variation has to be accommodated in order to avoid die damage and to prevent flash from flowing onto the die.

SUMMARY OF THE INVENTION

In accordance with the present invention, a method and system for exposed die molding for integrated circuit packaging are provided. In particular, a floating plunger is provided as part of a lower mold during the molding process in order to accommodate greater variation in bondline thicknesses.

According to one embodiment of the present invention, a method for exposed die molding for integrated circuit packaging is provided that includes providing a mold comprising an upper mold with a flexible material, a lower mold, and a floating plunger. A substrate of an integrated circuit structure is clamped between the upper mold and the lower mold. An integrated circuit die of the integrated circuit structure is clamped between the floating plunger and the upper mold through the flexible material.

According to another embodiment of the present invention, a method for exposed die molding for integrated circuit packaging is provided that includes providing a mold comprising an upper mold, a lower mold, and a floating plunger. An integrated circuit die with a flexible material is provided. The integrated circuit die is coupled to a substrate. The substrate is clamped between the upper mold and the lower mold. The integrated circuit die is clamped between the floating plunger and the upper mold through the flexible material.

According to yet another embodiment of the present invention, a system for exposed die molding for integrated circuit packaging is provided that includes an integrated circuit structure, a mold, and a flexible material. The integrated circuit structure comprises an integrated circuit die and a substrate. The mold comprises an upper mold, a lower mold, and a floating plunger. The upper mold and the lower mold are operable to clamp the substrate. The floating plunger and the upper mold, through the flexible material, are operable to clamp the integrated circuit die.

Technical advantages of one or more embodiments of the present invention include providing an improved method for exposed die molding for integrated circuit packaging. In a particular embodiment, a floating plunger is provided as part of a lower mold during the molding process for a set of integrated circuits. As a result, the variation in bondline thicknesses that may be accommodated is greatly increased.

In another embodiment, the floating plunger is operable to be tilted at an angle in accordance with the angle associated with the tilt of the adhesive layer. As a result, the variation in tilt that may be accommodated is greatly increased.

Other technical advantages will be readily apparent to one skilled in the art from the following figures, description, and claims.

Before undertaking the DETAILED DESCRIPTION OF THE INVENTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which:

FIGS. 2A–14 D are block diagrams illustrating a system for exposed die molding for integrated circuit packaging in accordance with another embodiment of the present invention; and FIG. 3 is a flow diagram illustrating a method for exposed die molding for integrated circuit packaging in accordance with one embodiment of the present invention.

DETAILED DESCRIPTION OF THE INVENTION

Figure 2A:
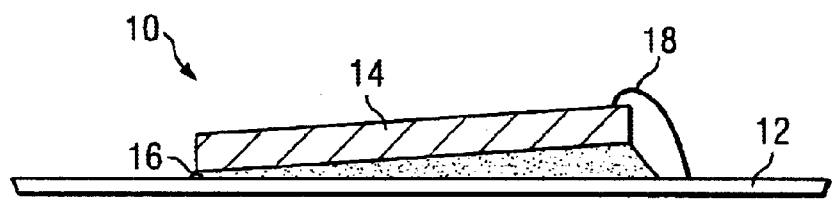
Figure 2B:
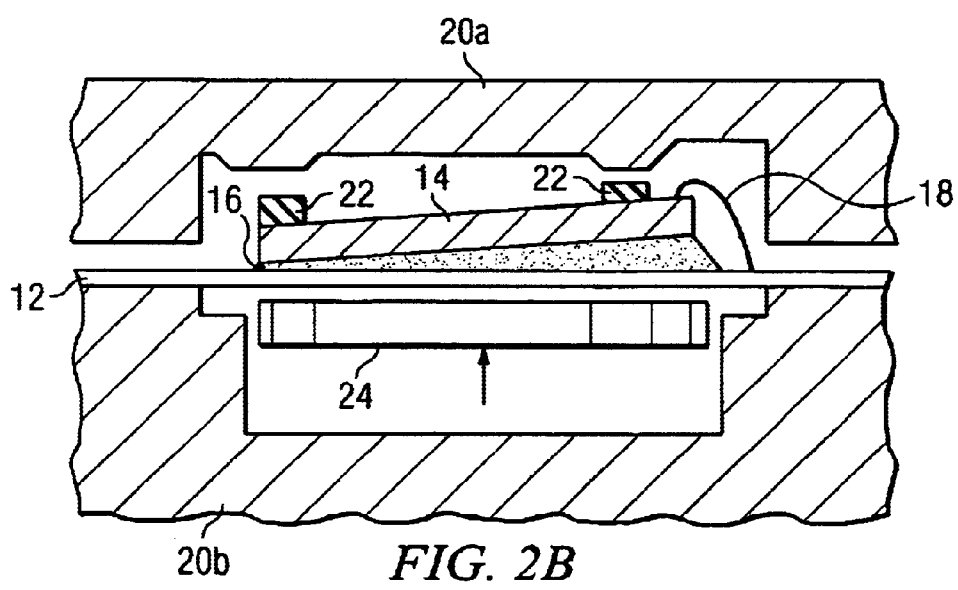
Figure 2C:
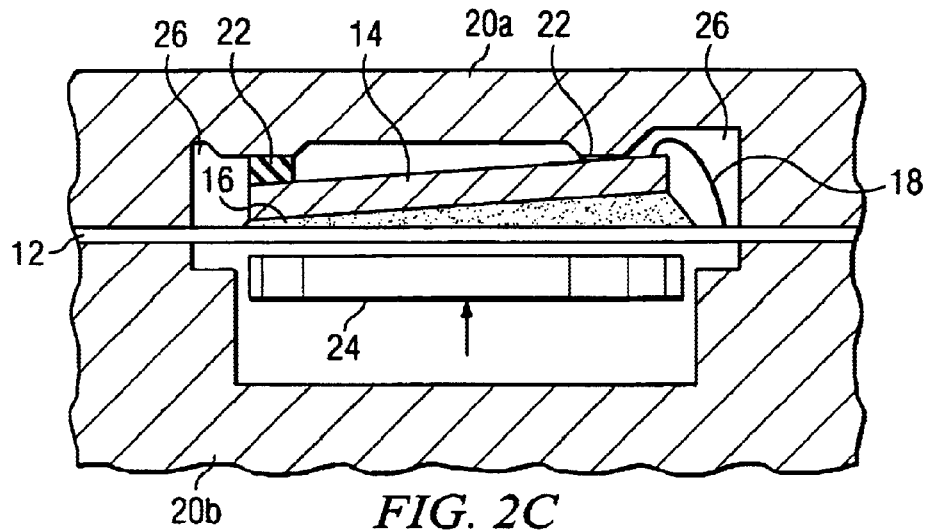
Figure 2D:
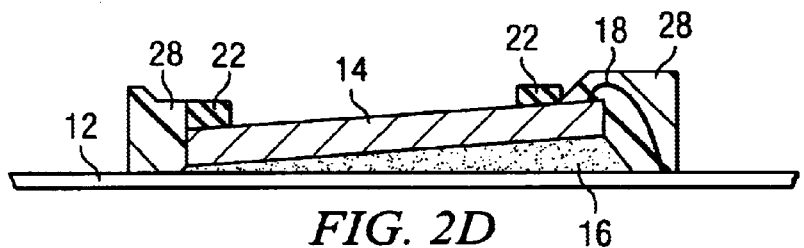
Figure 3:
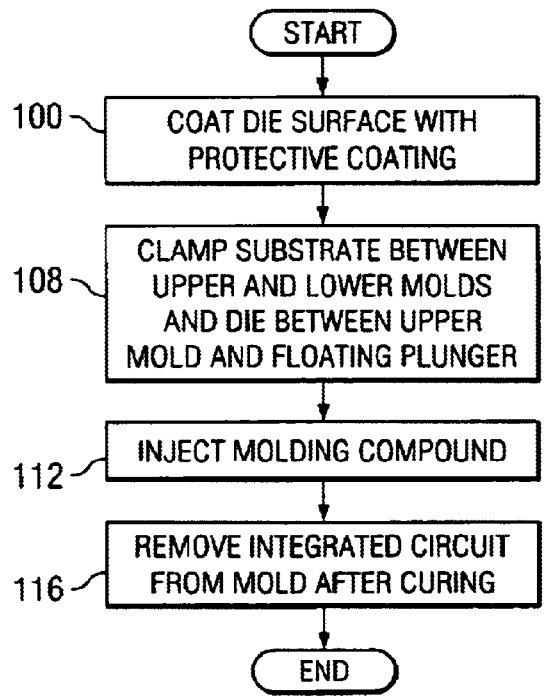

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented for any suitably arranged integrated circuit mold.

Figure 1A:
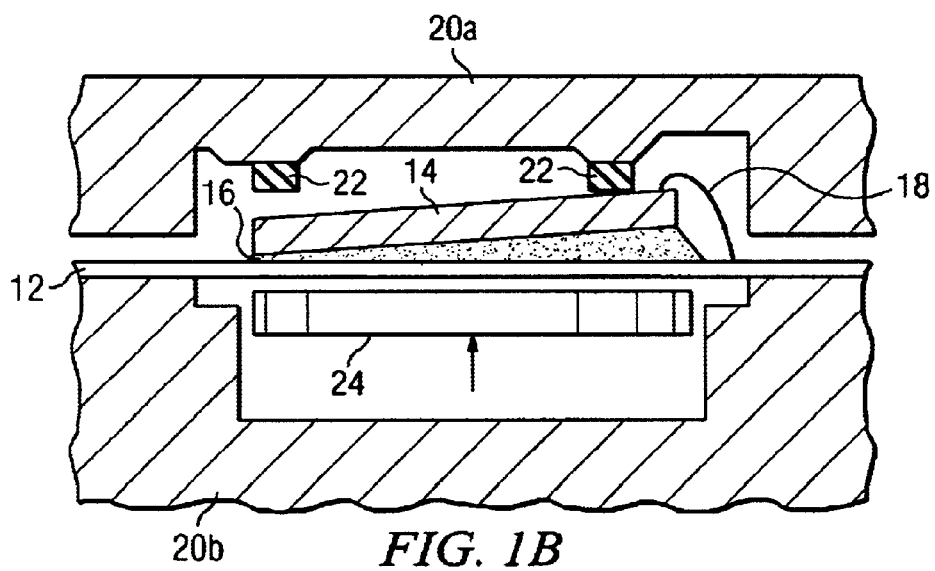
FIGS. 1A–D are block diagrams illustrating a system for exposed die molding for integrated circuit packaging in accordance with one embodiment of the present invention.

FIGS. 1A–D are block diagrams illustrating a system for exposed die molding for integrated circuit packaging in accordance with one embodiment of the present invention. FIG. 1A illustrates an integrated circuit structure 10 prior to the molding process.

The integrated circuit structure 10 comprises a substrate 12 and an integrated circuit die 14 coupled to the substrate 12 through an adhesive layer 16. The integrated circuit structure 10 also comprises at least one bonding wire 18 operable to couple a specified area of the integrated circuit die 14 to the substrate 12.

The substrate 12 may comprise a fiberglass material or other suitable insulating material. The integrated circuit die 14 may comprise a sensor, such as a fingerprint sensor, a pressure sensor, a chemical sensor, or the like. The integrated circuit die 14 may comprise silicon or other suitable material. According to one embodiment, the integrated circuit die 14 may be coated with a protective coating, such as Teflon or other suitable material, (not illustrated in FIGS. 1A–D) prior to the molding process.

The adhesive layer 16 may comprise silver-filled epoxy or other suitable adhesive material. According to one embodiment, the adhesive layer 16 may comprise a bondline thickness of about 20 to about 50 microns and a tilt of about 0 to about 30 microns. However, it will be understood that the adhesive layer 16 may comprise any suitable bondline thickness and tilt without departing from the scope of the present invention. The bonding wire 18 may comprise a gold compound, such as Ni/Au, or other suitable electrically conductive material.

Figure 1B:
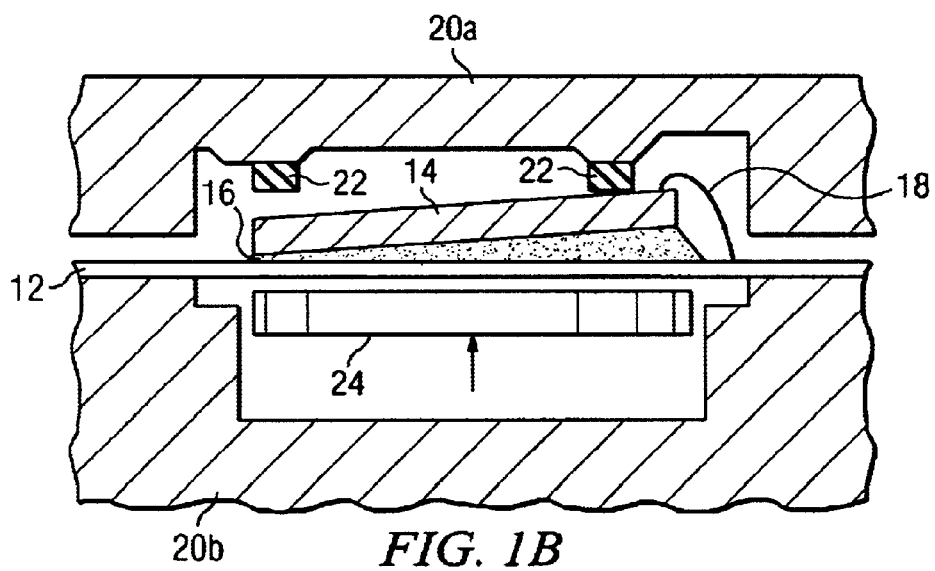

FIG. 1B illustrates the integrated circuit structure 10 of FIG. 1A in a mold 20. The mold 20 comprises an upper mold 20a and a lower mold 20b. According to one embodiment, the mold 20 comprises steel. However, it will be understood that the mold 20 may comprise any suitable material without departing from the scope of the present invention.

The upper mold 20a illustrated in FIG. 1B comprises a flexible material 22 that is operable to protect the surface of the integrated circuit die 14 from the hard surface of the upper mold 20a which would otherwise come into contact with the integrated circuit die 14 during the molding process.

According to one embodiment, the flexible material 22 comprises a ring around the upper mold 20a above the surface of the integrated circuit die 14. However, it will be understood that the flexible material 22 may comprise any suitable form without departing from the scope of the present invention.

Figure 1C:
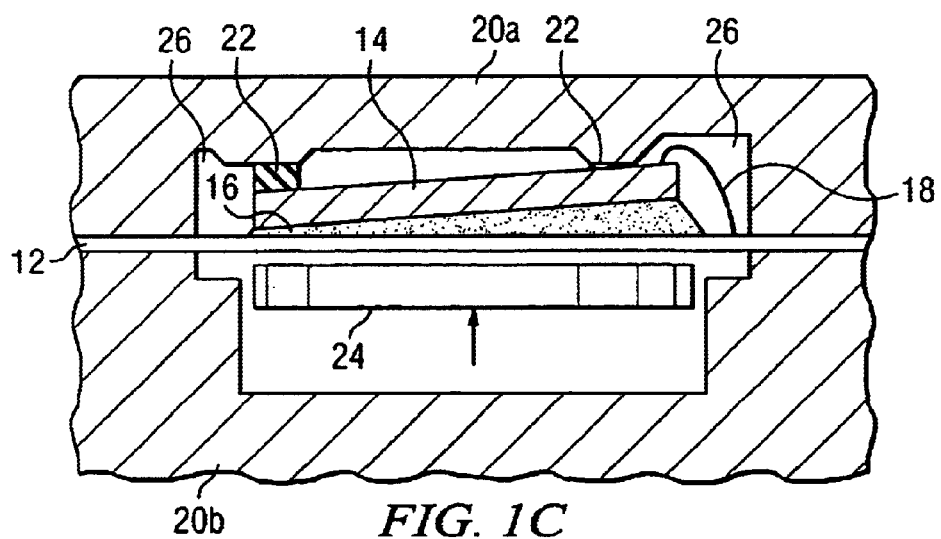

The mold 20 also comprises a floating plunger 24 that is operable to provide pressure to the substrate 12 as illustrated by the arrow in FIGS. 1B–C. The floating plunger 24 allows the mold 20 to provide a protective layer for a set of integrated circuits 10 while providing accommodation for a relatively large bondline thickness variation.

In accordance with an alternative embodiment, the floating plunger 24 is operable to be tilted at an angle in accordance with the angle associated with the tilt of the adhesive layer 16. For this embodiment, the floating plunger 24 may allow the mold 20 to provide a protective layer for a set of integrated circuits 10 while providing accommodation for a larger tilt variation than would be possible without a floating plunger 24.

FIG. 1C illustrates the upper mold 20a clamped down over the substrate 12 and, through the flexible material 22, the integrated circuit die 14. Because of the varying thickness of the adhesive layer 16, the flexible material 22 at the right side of the upper mold 20a is deformed more than the flexible material 22 at the left side of the upper mold 20a.

At this stage of the molding process, a molding compound may be injected into the open areas 26 between the upper mold 20a, the substrate 12, the integrated circuit die 14 and the flexible material 22. The molding compound may comprise an epoxy, a resin or other suitable molding material. According to the illustrated embodiment, molding compound is not injected above a substantial portion of the integrated circuit die 14 so as to form an exposed die.

Figure 1D:
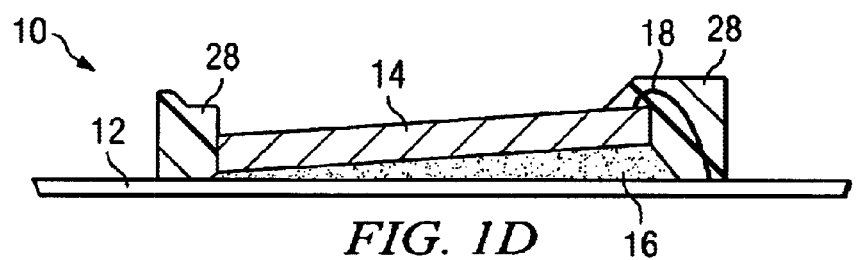

FIG. 1D illustrates the integrated circuit structure 10 after removal from the mold 20. The molding compound has been cured to form a protective layer 28. The protective layer 28 is operable to cover the bonding wire 18, the die edge and specified areas on the die, thereby protecting the electrical connections between the integrated circuit die 14 and the substrate 12.

FIGS. 2A–D are block diagrams illustrating a system for exposed die molding for integrated circuit packaging in accordance with another embodiment of the present invention. FIG. 2A illustrates an integrated circuit structure 10 prior to the molding process.

The integrated circuit structure 10 comprises a substrate 12 and an integrated circuit die 14 coupled to the substrate 12 through an adhesive layer 16. The integrated circuit structure 10 also comprises at least one bonding wire 18 operable to couple a specified area of the integrated circuit die 14 to the substrate 12.

The substrate 12 may comprise a fiberglass material or other suitable insulating material. The integrated circuit die 14 may comprise a sensor, such as a fingerprint sensor, a pressure sensor, a chemical sensor, or the like. The integrated circuit die 14 may comprise silicon or other suitable material. According to one embodiment, the integrated circuit die 14 may be coated with a protective coating, such as Teflon or other suitable material, (not illustrated in FIGS. 2A–D) prior to the molding process.

The adhesive layer 16 may comprise silver-filled epoxy or other suitable adhesive material. According to one embodiment, the adhesive layer 16 may comprise a bondline thickness of about 20 to about 50 microns and a tilt of about 0 to about 30 microns. However, it will be understood that the adhesive layer 16 may comprise any suitable bondline thickness and tilt without departing from the scope of the present invention. The bonding wire 18 may comprise a gold compound, such as Ni/Au, or other suitable electrically conductive material.

FIG. 2B illustrates the integrated circuit structure 10 of FIG. 2A in a mold 20. The mold 20 comprises an upper mold 20a and a lower mold 20b. According to one embodiment, the mold 20 comprises steel. However, it will be understood that the mold 20 may comprise any suitable material without departing from the scope of the present invention.

The integrated circuit die 14 illustrated in FIG. 2B comprises a flexible material 22 that does not adhere to a molding compound and that is operable to prevent molding compound flash on the integrated circuit die 14 by sealing the die area to be exposed and to protect the surface of the integrated circuit die 14 from the hard surface of the upper mold 20a which would otherwise come into contact with the integrated circuit die 14 during the molding process. According to one embodiment, the flexible material 22 comprises a ring around the edge of the integrated circuit die 14. However, it will be understood that the flexible material 22 may comprise any suitable form without departing from the scope of the present invention.

The mold 20 also comprises a floating plunger 24 that is operable to provide pressure to the substrate 12 as illustrated by the arrow in FIGS. 2B–C. The floating plunger 24 allows the mold 20 to provide a protective layer for a set of integrated circuits 10 while providing accommodation for a relatively large bondline thickness variation.

In accordance with an alternative embodiment, the floating plunger 24 is operable to be tilted at an angle in accordance with the angle associated with the tilt of the adhesive layer 16. For this embodiment, the floating plunger 24 may allow the mold 20 to provide a protective layer for a set of integrated circuits 10 while providing accommodation for a larger tilt variation than would be possible without a floating plunger 24.

FIG. 2C illustrates the upper mold 20a clamped down over the substrate 12 and, through the flexible material 22, the integrated circuit die 14. Because of the varying thickness of the adhesive layer 16, the flexible material 22 at the right side of the integrated circuit die 14 is deformed more than the flexible material 22 at the left side of the integrated circuit die 14.

At this stage of the molding process, a molding compound may be injected into the open areas 26 between the upper mold 20a, the substrate 12, the integrated circuit die 14 and the flexible material 22. The molding compound may comprise an epoxy, a resin or other suitable molding material. According to the illustrated embodiment, molding compound is not injected above a substantial portion of the integrated circuit die 14 so as to form an exposed die.

FIG. 2D illustrates the integrated circuit structure 10 after removal from the mold 20. The molding compound has been cured to form a protective layer 28. The protective layer 28 is operable to cover the bonding wire 18, the die edge and specified areas on the die, thereby protecting the electrical connections between the integrated circuit die 14 and the substrate 12.

For this embodiment, the flexible material 22 remains on the integrated circuit die 14 after the molding process is complete. However, it will be understood that the flexible material 22 may be removed at this stage if desired.

FIG. 3 is a flow diagram illustrating a method for exposed die molding for integrated circuit packaging in accordance with one embodiment of the present invention. The method begins at optional step 100 where the surface of the integrated circuit die 14 may be coated with a protective coating, such as Teflon or other suitable material.

At step 108, the substrate 12 of the integrated circuit structure 10 is clamped between the upper mold 20a and the lower mold 20b, and the integrated circuit die 14 is clamped between the floating plunger 24 and the upper mold 20a through the flexible material 22.

At step 112, molding compound, or other suitable encapsulation material, is injected into the open areas 26. At step 116, the integrated circuit structure 10 is removed from the mold 20 after the molding compound has been cured, at which point the method comes to an end.

In this way, variations in bondline thicknesses are accommodated through the use of the floating plunger 24 and flexible material 22. In addition, allowing the floating plunger 24 to tilt at an angle allows a greater accommodation of tilt variations. Accordingly, the molding process is made more robust, producing a higher quality result while allowing larger variations in die attach material thicknesses and tilt.

Although the present invention has been described with several embodiments, various changes and modifications may be suggested to one skilled in the art. It is intended that the present invention encompass such changes and modifications as fall within the scope of the appended claims.

What is claimed is:

1. A method for exposed die molding for integrated circuit packaging, comprising:

providing a mold comprising an upper mold with a flexible material, a lower mold, and a floating plunger;

clamping a substrate of an integrated circuit structure between the upper mold and the lower mold; and clamping an integrated circuit die of the integrated circuit structure between the floating plunger and the upper mold through the flexible material such that at least a portion of the flexible material lies between the integrated circuit die and the upper mold.

2. The method of claim 1, further comprising injecting a molding compound into open areas formed around the integrated circuit die and over the substrate.

3. The method of claim 1, further comprising coating the surface of the integrated circuit die with a protective coating.

4. The method of claim 1, further comprising allowing the floating plunger to tilt at an angle corresponding to a thickness of an adhesive layer coupling the integrated circuit die to the substrate.

5. The method of claim 1, the mold comprising steel.

6. The method of claim 1, wherein:

the flexible material comprises a ring of flexible material; and the ring of flexible material has a different depth at two or more positions along the ring as a result of clamping the integrated circuit die between the floating plunger and the upper mold.

7. The method of claim 1, wherein the integrated circuit die comprises a sensor, and further comprising injecting a molding compound into open areas formed around the integrated circuit die and over the substrate while leaving at least a portion of the sensor exposed.

8. A method for exposed die molding for integrated circuit packaging, comprising:

providing a mold comprising an upper mold, a lower mold, and a floating plunger;

providing an integrated circuit die with a flexible material, the integrated circuit die coupled to a substrate;

clamping the substrate between the upper mold and the lower mold; and clamping the integrated circuit die between the floating plunger and the upper mold through the flexible material such that at least a portion of the flexible material lies between the integrated circuit die and the upper mold.

9. The method of claim 8, further comprising injecting a molding compound into open areas formed around the integrated circuit die and over the substrate.

10. The method of claim 8, further comprising coating the surface of the integrated circuit die with a protective coating.

11. The method of claim 8, further comprising allowing the floating plunger to tilt at an angle corresponding to a thickness of an adhesive layer coupling the integrated circuit die to the substrate.

12. The method of claim 8, the mold comprising steel.

13. The method of claim 8, wherein:

the flexible material comprises a ring of flexible material; and the ring of flexible material has a different depth at two or more positions along the ring as a result of clamping the integrated circuit die between the floating plunger and the upper mold.

14. The method of claim 8, wherein the integrated circuit die comprises a sensor, and further comprising injecting a molding compound into open areas formed around the integrated circuit die and over the substrate while leaving at least a portion of the sensor exposed.

15. A system for exposed die molding for integrated circuit packaging, comprising:

an integrated circuit structure comprising an integrated circuit die and a substrate;

a mold comprising an upper mold, a lower mold, and a floating plunger;

a flexible material;

the upper mold and the lower mold operable to lamp the substrate; and the floating plunger and the upper mold, through the flexible material, operable to clamp the integrated circuit die such that at least a portion of the flexible material lies between the integrated circuit die and the upper mold.

16. The system of claim 15, further comprising a molding compound injected into open areas formed around the integrated circuit die and over the substrate.

17. The system of claim 15, further comprising an adhesive layer operable to couple the integrated circuit die to the substrate, the floating plunger operable to be tilted at an angle corresponding to a thickness of the adhesive layer.

18. The system of claim 15, the mold comprising steel.

19. The system of claim 15, wherein:

the flexible material comprises a ring of flexible material; and the ring of flexible material has a different depth at two or more positions along the ring when the floating plunger and the upper mold clamp the integrated circuit die.

20. The system of claim 15, wherein the integrated circuit die comprises a sensor, and further comprising a molding compound injected into open areas formed around the integrated circuit die and over the substrate while leaving at least a portion of the sensor exposed.

* * * * *